United States Patent [19]

Galvin et al.

[11] 4,206,449

[45] Jun. 3, 1980

[54] MULTIPLE SENSOR INTRUSION ALARM SYSTEM

[75] Inventors: Aaron A. Galvin, Lexington; Sheldon P. Apsell, Nahant; Daniel Crown, West Newton, all of Mass.

[73] Assignee: American District Telegraph Company, New York, N.Y.

[21] Appl. No.: 819,464

[22] Filed: Jul. 27, 1977

[51] Int. Cl.[2] ....................... G08C 15/12; G08B 19/00; H03K 13/20; H04Q 3/00

[52] U.S. Cl. ................................ 340/505; 340/152 T; 340/183; 340/518; 340/521; 340/527; 340/534; 367/93

[58] Field of Search ............... 340/167 A, 216, 258 R, 340/258 A, 258 B, 408, 409, 413, 416, 505, 518, 521, 524, 527, 534, 541, , 558, 152 T, 183; 343/5 PD

[56] References Cited

U.S. PATENT DOCUMENTS

| | | | |
|---|---|---|---|
| 3,178,515 | 4/1965 | Bramer et al. | 179/15 |
| 3,611,361 | 10/1971 | Gallichotte et al. | 340/408 |
| 3,634,824 | 1/1972 | Zinn et al. | 340/147 R |
| 3,653,041 | 3/1972 | McGrath et al. | 340/409 |
| 3,735,396 | 5/1973 | Getchell | 340/413 |
| 3,927,404 | 12/1975 | Cooper | 340/413 |
| 3,986,182 | 10/1976 | Hackett | 340/258 A |
| 4,067,008 | 1/1978 | Sprowls | 340/409 |
| 4,077,030 | 2/1978 | Helavz | 340/183 |

*Primary Examiner*—John W. Caldwell, Sr.
*Assistant Examiner*—Joseph E. Nowicki
*Attorney, Agent, or Firm*—Weingarten, Maxham & Schurgin

[57] ABSTRACT

A multiple sensor intrusion alarm system including a central controller which communicates with a plurality of sensors over a single, interconnecting cable. The controller periodically polls each of the sensors, and in response to this polling signal, each sensor returns a signal indicating its status. The absence of a return signal from a particular sensor indicates to the controller that the sensor is malfunctioning or has been tampered with. In a preferred embodiment, the interconnecting cable is a single, two-conductor cable. The controller may also be connected to an alarm panel or remote monitoring station to indicate the presence of an alarm condition.

13 Claims, 6 Drawing Figures

MULTIPLE SENSOR INTRUSION ALARM SYSTEM

FIELD OF THE INVENTION

This invention relates to alarm systems and more particularly to alarm systems which continuously monitor the status of the individual sensors in the system.

BACKGROUND OF THE INVENTION

Existing fire alarm and intrusion alarm systems suffer from a number of weaknesses which have resulted from the revolutionary growth of these types of systems. Such alarm installations typically consist of a variety of different types of sensors connected in a series loop, such as a McCullough loop, such that any sensor which alarms will trigger a local or remote station alarm. With such a system, there is no way of telling at the remote location which sensor has alarmed; and this results in problems both in locating the area where an actual intrusion has occurred and in trouble-shooting a system for recurring false alarms.

Very little standardization exists in this area. It frequently happens that within one installation, different types of wires, interconnection techniques, and sensors are used to provide similar protection. This wide diversity of installation practices complicates both the installation of such a system and later trouble-shooting or servicing, especially where such servicing is done by someone not familiar with the original installation.

Because of this lack of compatibility, there are generally no centralized test provisions. Individual sensors require different methods of testing, and in general, someone must actually go to each sensor to perform the test locally. Also, the security of such a system is generally poor. Sensors may easily be jumpered out, and short or open circuits can develop which eliminate sensors from the system without any indication thereof.

SUMMARY OF THE INVENTION

The present invention described in detail below provides a novel system for controlling and interconnecting individual alarm sensors which overcome the above-described problems while maintaining the cost of such a system within the range required to make it economically feasible. In the present system, all sensors are connected in parallel to a single, two-conductor cable. A sensor coordinator periodically polls each of the sensors. In response to a polling signal, each sensor sends back a return signal indicating its status. The return signal provides an indication that each sensor is in a non-alarm state, or in one of a plurality of alarm states. The absence of a signal from a particular sensor is also detected by the sensor coordinator which then provides an indication thereof so that the sensor may be checked for tampering or malfunction. The sensor coordinator may be connected with an alarm panel and/or a control station to indicate the presence and type of alarm condition and to designate in which zone an alarm has occurred.

DETAILED DESCRIPTION OF THE PREFERRED EMBODIMENT

In the following detailed description, a new type of alarm system is described which is an integrated network of power supply, annunciator, sensor coordinator, and sensors. The particular configuration of the alarm system solves many of the problems of prior art systems described above and provides additional advantageous features.

Figure 1:
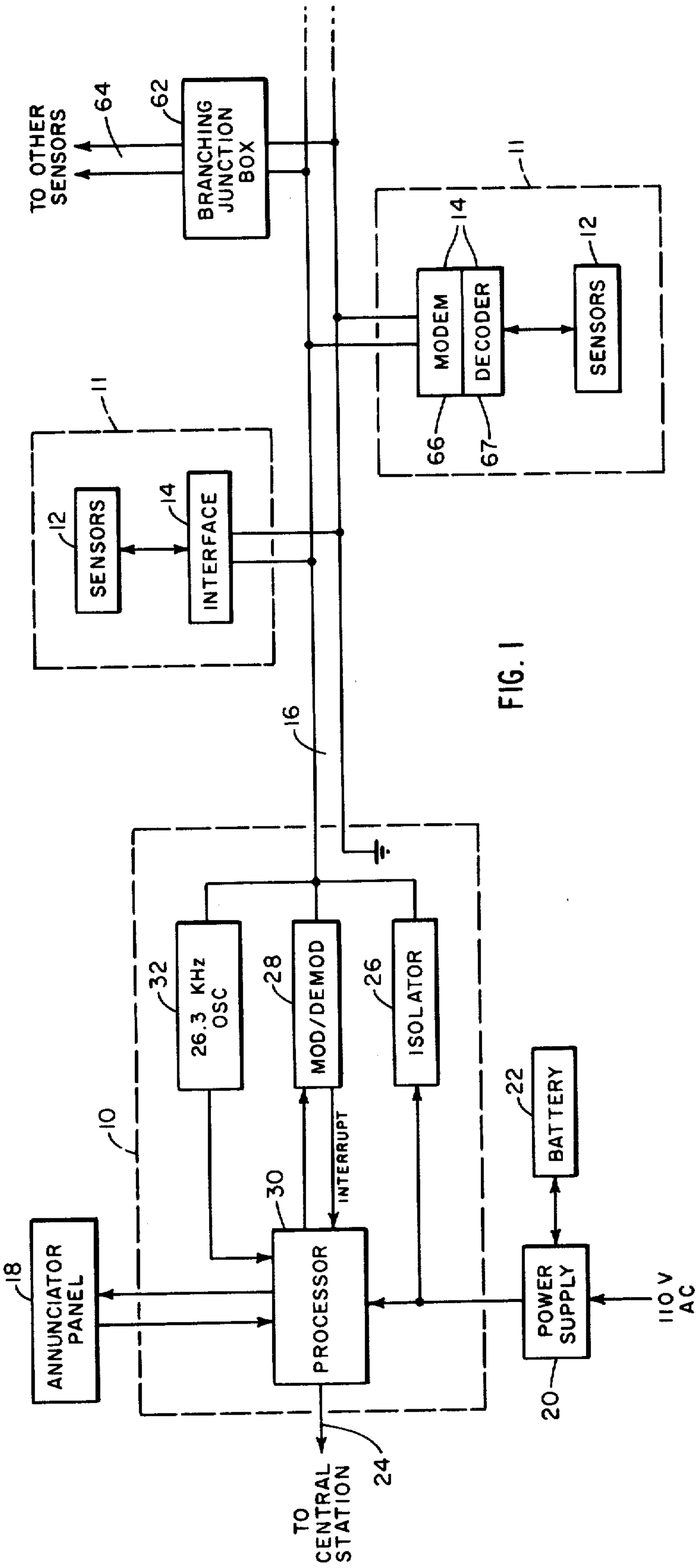
FIG. 1 is a block diagram of an intrusion alarm system embodying the present invention.

Referring to FIG. 1, there is shown in block diagram form the alarm system of the present invention. The principal parts of the alarm system include a sensor coordinator 10, one or more protected areas 11, including a sensor 12 and associated interface 14, and an interconnecting two-wire cable 16 to which each of the interfaces 14 are connected in parallel to provide communication between the sensor coordinator 10 and the plurality of sensors 12.

Power is provided to sensor coordinator 10 by power supply 20 which is usually powered by 110 volt AC power. A battery 22 is connected to power supply 20 to provide back-up power in the event of failure of AC power. Battery 22 may be selected to provide the necessary power for different system configurations.

The sensor coordinator 10 is typically connected to an annunciator panel 18 for displaying alarm and status information. Also located on annunciator panel 18 are the various switches, displays, and controls accessible to an operator. Sensor coordinator 10 may also be connected to a remote central station, as shown by cable 24, to provide remote alarm indications. Alternatively, this connection may be omitted and the system may operate independently.

Along cable 16 are transmitted power to remote sensors 12 and interfaces 14, digital signals between sensor coordinator 10 and interfaces 14 indicating the condition and status of each of the sensors, and a high frequency signal used in ultrasonic intrusion protection sensors, and also used as the system clock. The manner in which all these signals are transmitted along cable 16 will become clear as the signal format is explained below.

Power is applied to cable 16 from power supply 20 through isolating electronics 26. Isolator 26 typically includes an inductor which prevents the higher signals present on cable 16 from being fed back to power supply 20 and from being shorted out by the low output impedance of power supply 20. A modulator/-demodulator (modem) 28 is connected to a processor 30 and allows digital data to be transmitted along cable 16 by processor 30 and to be received from remote interfaces 14 by processor 30. A 26.3 kHz oscillator 32 connected to cable 16 provides a high frequency signal superimposed upon the DC signal from power supply 20.

In operation, processor 30 periodically transmits a "synchronizing" pulse along cable 16. Upon reception of this synchronizing pulse, each of the interfaces 14 waits for a predetermined delay time and then transmits back a pulse to processor 30, the pulse width being indicative of the status of the associated sensor 12. Each of the interfaces 14 connected to cable 16 has a different characteristic delay time so that the pulses transmitted back to processor 30 by the interfaces 14 will occur in succession and not interfere with other pulses. Processor 30, after transmitting a synchronizing pulse, monitors the signals present on cable 16. As each interface 14 successively transmits back a pulse, these pulses are identified with the proper interface/sensor combination by processor 30, based on the delay of each pulse from the synchronizing pulse. As each pulse is received by processor 30, it measures the width of the pulse to determine the status of the associated sensor. Even in the non-alarm condition, each interface 14 transmits back a particular pulse width to processor 30, indicating such a non-alarm condition. Accordingly, if processor 30 receives a pulse width indicating an alarm condition or other trouble, it will so indicate on annunciator panel 18 and via central station connection 24. Also, if a sensor/interface combination has been tampered with or is malfunctioning so that it is not returning a status pulse, processor 30 will detect the absence of such a pulse and similarly provide an indication thereof.

Figure 2A:
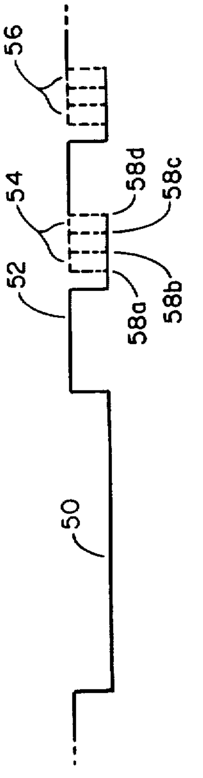
FIGS. 2A, 2B and 2C show waveforms useful in explaining the invention.
Figure 2B:
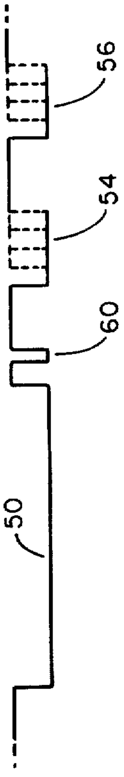
Figure 2C:
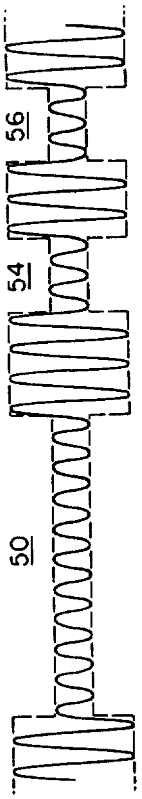

The above-described operation may be more clearly seen with reference to the waveforms shown in FIGS. 2A, 2B and 2C. The waveforms in FIGS. 2A and 2B show the digital data which is superimposed upon the DC power and the 26.3 kHz signals present on cable 16 by modulator/demodulator 28 and interfaces 14. It will be appreciated that while FIGS. 2A and 2B are explained in terms of absolute signal magnitudes, the digital signals shown are present on cable 16 simultaneously with these other signals. This is shown in FIG. 2C which shows the actual signal present on cable 16, corresponding with the waveform in FIG. 2A.

Referring to FIG. 2A, there is shown a typical waveform format which might be utilized by the system shown in FIG. 1. Normally, the potential across cable 16 is held high by power supply 20 and isolator 26. At predetermined intervals, processor 30 and modulator/demodulator 28 reduce the amplitude of the 26.3 kHz signal on cable 16 to provide a synchronizing pulse, as shown by pulse 50 in FIGS. 2A and 2C. Typically, this synchronizing pulse is 100 milliseconds long and occurs every one second. Following synchronizing pulse 50, there is an interval 52, of approximately 10 milliseconds in length, the purpose of which is described below. Following this, there is a series of time slots 54, 56, and so on. Each of these time slots corresponds with a particular interface/sensor combination; and each interface/sensor combination transmits back a pulse during its time slot in response to the synchronizing pulses 50 transmitted by processor 30. The width of the pulse transmitted by interface 14 is indicative of the status of the associated sensor 12. This is shown in FIG. 2A for the time slot 54. If, for example, each return pulse may have one of four different widths, the trailing edge of the pulse in time slot 54 might occur at any of the times denoted by 58A–58D. The width of each pulse is measured by processor 30 and provides information thereto as to the status of the associated sensor 12.

It is frequently desirable to be able to automatically test each of the sensors in an alarm system to verify the proper operation thereof. Referring to FIG. 2B, one method by which the system of the present invention may implement such a self-test procedure is shown. As described above, processor 30 transmits a synchronizing pulse 50 at regular intervals. If it is desired to perform a self-test, immediately following synchronizing pulse 50, processor 30 transmits a second pulse 60 during the above-described period 52. This pulse is typically 5 milliseconds long. The leading edge of this second pulse 60 is received by the interfaces 14 and indicates that a self-test procedure is to be carried out, as described below. Following pulses 50 and 60, each of the individual sensor/interface combinations will respond in the same proper time slots 54, 56, etc., following synchronizing pulse 50, the results of the self-test performed by each of the sensors being indicated by the width of the pulse transmitted back, as described above.

Processor 30 may be implemented in many different forms, including hard-wired logic or a microprocessor. Typically, the latter is used due to the added system flexibility which results. One microprocessor suitable for use with the present invention is the Fairchild F-8 microprocessor. It has been found to be advantageous to connect the demodulated signals from cable 16 to an interrupt input of processor 30, rather than to one of the input ports, although, of course, the present invention can equally well be practiced by using conventional I/O connections to processor 30. The use of a microprocessor or the equivalent for processor 30 allows other useful features to be implemented in an alarm system.

One such feature which has been found to be desirable is to have processor 30 monitor the 110 V AC power. Upon failure of AC power and a switch to battery power by power supply 20, processor 30 can then disconnect power from or turn off display lights on annunciator panel 18 and other unnecessary power-consuming devices. Processor 30 would then provide only a signal along cable 24 to the central station in the event of fire or intrusion. When a person responds to the alarm, he actuates a control on annunciator panel 18 which causes processor 30 to reactive the displays thereon to provide an indication of which sensor alarmed and where the trouble is. By this procedure, the power available in battery 22 may be conserved to provide back-up protection for a longer time in the event of a power outage.

In the preferred embodiment described, up to sixty-three individual interfaces 14 may be addressed by sensor coordinator 10. The circuitry described herein may be easily modified to enable sensor coordinator 10 to directly address a larger number of interfaces. Alternatively, a branching junction box 62 may be used to connect cable 16 with a second cable 64 to which other sensors/interface combinations may be connected.

Each of the interfaces 14 includes a modem circuit 66, connected to cable 16, which demodulates and modulates data transmitted to and from sensor 12, and a decoder circuit connected to sensor 12 which causes the proper pulse width to be transmitted back to sensor coordinator 10 at the proper time following each synchronizing pulse 50 in response to signals from sensors 12.

Figure 3:
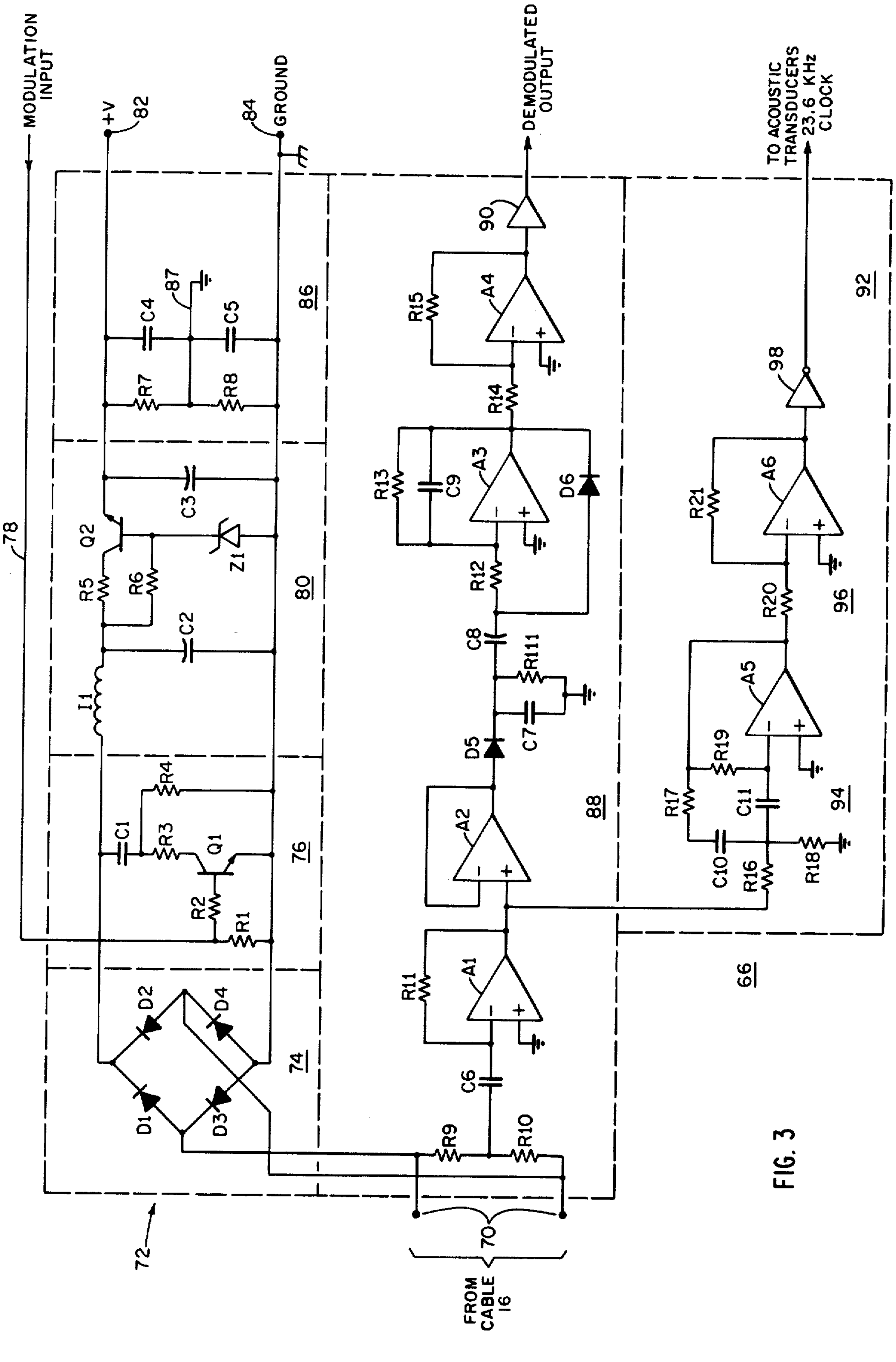
FIG. 3 is a schematic diagram of one circuit suitable for use as the modem of FIG. 1.

Referring to FIG. 3, there is shown circuitry suitable for use as the modem 66 in interface 14. The modem is connected to cable 16 via terminals 70. Power is derived from the conductors of cable 16 by means of circuitry 72. Cable 16 is preferably made up of a twisted-pair, two-conductor cable to reduce the cost of wiring the installation. To allow the modem to be connected to cable 16 with either polarity, the signal from cable 16 is first applied to a full-wave rectifier 74 composed of diodes D1-D4 connected as shown in FIG. 3. The output from rectifier 74 consists of the voltage from power supply 20, typically 12–24 volts, with the above-described digital signals and the 26.3 kHz signal superimposed thereon.

The output from rectifier 72 is applied to modulating circuitry 76. Signals from decoder 67 are applied to the base of transistor Q1 via resistors R1 and R2 as shown. Normally, the input to modulating circuitry 76 is low, forcing Q1 into the off state. In response to positive pulses from decoder 67, Q1 is selectively turned on and off, shorting the output from rectifier 74, and thus the potential across cable 16, via capacitor C1 and resistors R3 and R4 connected as shown. In this manner, pulses from decoder 67 are transmitted back to sensor coordinator 10 along cable 16.

The output from modulating circuitry 76 is applied to power supply circuitry 80. A low-pass filter composed of inductor I1 and capacitor C2 filters out any modulation which may be present on the output from circuitry 76. The output from this low-pass filter is applied to a conventional voltage regulator made up of resistors R5 and R6, transistor Q2, zener diode A1, and capacitor C3 connected as shown to provide a regulated output voltage on terminal 82 with respect to ground terminal 84. Typically, this voltage is 6–12 volts.

Circuitry 86 is connected between +V and ground to provide a "pseudo-ground." This circuitry includes a resistive voltage divider composed of series-connected resistors R7 and R8 and series-connected capacitors C4 and C5 connected between +V and ground as shown. The junctions between R7 and R8 and between C4 and C5 are connected to provide the pseudo-ground at a potential half-way between ground and +V for purposes described below.

The digital data from sensor coordinator 10 is demodulated by demodulating circuitry 88. The output from cable 16 is taken from the midpoint of equivalue resistors R9 and R10 connected thereacross. As explained above, the polarity of the signal applied to terminal 70 is unknown; and by taking the input to demodulation circuitry 88 from the junction of resistors R9 and R10 with respect to the pseudo-ground derived by circuitry 86, the demodulated signal is the same for all modems regardless of the polarity of their connection to cable 16. The signal from resistors R9 and R10 is applied to a differentiating circuit composed of capacitor C6, resistor R11, and amplifier A1, connected as shown. Note that the non-inverting input of amplifier A1 is referenced to pseudo-ground 87.

The output from amplifier A1 is applied through buffer amplifier A2 to a detector circuit made up of diode D5, capacitor C7, and resistor R111. The output from the detector circuit is applied via capacitor C7 to a level-shifting circuit made up of resistors R12 and R13, capacitor C9, diode D6, and amplifier A3. The level-shifting circuit provides a digital output with levels of +V and ground at its output.

The output from the level-shifting circuit is amplified via op-amp A4 and resistors R14 and R15 and applied to one or more digital buffers 90 to provide a digital output which is applied to decoder 67.

The output from amplifier A1 is also applied to filter circuitry 92 which provides a clean 26.3 kHz squarewave output signal. This 26.3 kHz signal is used as a driving signal for ultrasonic intrusion alarm transducers and is also used as a clock signal by the decoder circuitry. The signal from amplifier A1 is applied to a conventional active filter composed of resistors R16-R19, capacitors C10 and C11, and op-amp A5. The Q of active filter 94 is typically approximately 20, and the output therefrom is a very pure 26.3 kHz sine wave. Following active filter 94 is a buffer amplifier 96 composed of resistors R20 and R21 and op-amp A6 connected as shown. The output from amplifier 96 is amplified by one or more digital inverters 98 to provide a digital 26.3 kHz output signal which serves as a clock signal for decoder circuitry 67.

The following values are typical values for the components shown in FIG. 3, with resistance given in ohms and capacitance given in microfarads:

| | | | | | |
|---|---|---|---|---|---|
| R1 | 1M | R12 | 4.7K | 03 | 100 |
| R2 | 10K | R13 | 100K | 03 | 100 |
| R3 | 330 | R14 | 100K | 04 | 0.01 |
| R4 | 3.3K | R15 | 200K | 05 | 0.01 |
| R5 | 100 | R16 | 121K | 06 | 0.001 |
| R6 | 10K | R17 | 100 | 07 | 0.01 |
| R7 | 470 | R18 | 156 | 08 | 22 |
| R8 | 470 | R19 | 242K | 09 | 0.001 |
| R9 | 100K | R20 | 10K | 010 | 0.001 |
| R10 | 100K | R21 | 1M | 011 | 0.001 |
| R11 | 1M | 01 | 0.1 | I1 | 10.0mH |
| R111 | 200K | 02 | 100 | Z1 | 5.75V |

The decoder 67 receives the demodulated output signals from modem 66 indicating that the sensor coordinator 10 has transmitted a synchronizing pulse. In response to this and to signals from the alarm sensors 12 indicating the status thereof, the decoder 67 generates a digital signal which is applied to line 78 and modulating circuitry 76 in modem 66 to transmit a pulse back to sensor coordinator 10. The signal from decoder 67 must occur at a predetermined interval following the synchronizing pulse from sensor coordinator 10, and the width of this pulse is indicative of the status of the associated sensors.

Figure 4:
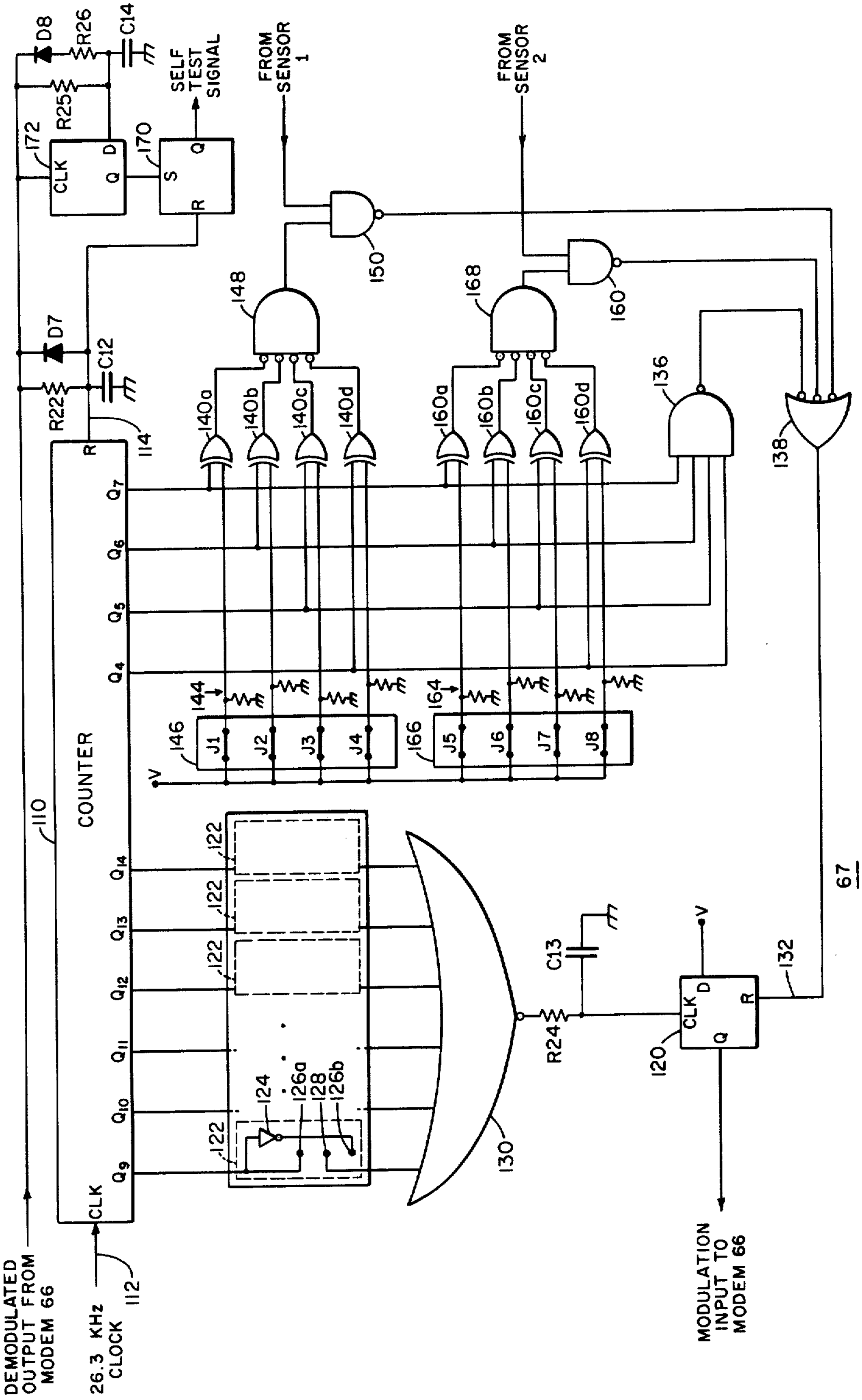
FIG. 4 is a schematic diagram of one circuit suitable for use in the decoder of FIG. 1.

Referring to FIG. 4, one circuit suitable for use as the decoder 67 in the present invention is shown. The 26.3 kHz clock signal is applied to the clock input of a binary counter 110. The length of counter 110 may be varied in accordance with the performance desired from the decoder, as will become obvious. The counter used in the preferred embodiment described herein, however, is a 14-bit binary counter. The demodulated output data from circuitry 88 is applied to the reset input 114 of counter 110 via resistor R22 and diode D7 connected in parallel as shown and shunted by capacitor C12 to ground. In response to a synchronizing pulse from sensor coordinator 10, the normally-low demodulated output from demodulating circuitry 88 goes high for 100 milliseconds. The time constant of resistor R22 and capacitor C12 is such that capacitor C12 will be charged to a high enough value during the 100 milliseconds synchronizing pulse 50 to reset counter 110. However, the time constant of resistor R22 and capacitor C12 is such that the much shorter status pulses transmitted back to sensor coordinator 10 by each of the interfaces 14 will not reset counter 110. When synchronizing pulse 50 ends, the output from demodulating circuitry 88 goes low, and capacitor C12 is immediately discharged through diode D7. Resetting counters 110 causes all counters 110 in each of the interfaces 14 to commence counting simultaneously.

The modulation output from decoder 67 is provided by D flip-flop 120 which operates in the following manner. When counter 110 is reset, the Q9-Q14 outputs (where Q14 is the most significant bit of the counter) are reset to zero. As the counter is incremented by the 26.3 kHz clock signal, the Q9-Q14 outputs will cycle through their various states. Each of these outputs is applied to an address module 122 on an address selection circuit board 123. In each address module 122, each output is inverted by an inverter 124, and the output and its inverse are applied to terminals 126A and 126B. By means of jumper wires or switches, each of the outputs Q9-Q14 or its inverse is selectively connected to an input 128 of NOR gate 130. When the state of outputs Q9-Q14 chosen by the positioning of the jumper wires is reached, the inputs to NOR gate 130 are all low and the output from NOR gate 130 goes high. In this manner, the time delay following synchronizing pulse 50 from sensor coordinator 10 may be designated for a particular interface 14 by properly connecting jumper wires in address modules 122.

The output from NOR gate 130 is applied to the clock input of a D flip-flop 120. A filter consisting of resistor R24 and capacitor C13 may be added to prevent flip-flop 120 from being clocked by spurious transient signals, especially if counter 110 is a ripple-carry-type of counter. Normally, the Q output from flip-flop 120 is low. The D input to flip-flop 120 is held high, and when the output from NOR gate 130 changes state, it clocks flip-flop 120, causing the Q output thereof to go high. This begins the status pulse transmitted back to sensor coordinator 10.

After the Q output from flip-flop 120 goes high, it remains high until the flip-flop is reset by a pulse on reset input 132. Thus, the timing of this reset pulse determines the pulse width transmitted to sensor coordinator 10. The reset pulse is generated in the following manner.

Outputs Q4-Q7 of counter 110 are applied to the inputs of NAND gate 136. At the time that counter outputs Q9-Q14 change to the selected state and the output from gate 130 goes low, commencing the pulse transmitted back to sensor coordinator 10, outputs Q4-Q7 are all low. After 128 clock pulses, Q4-Q7 are all high, causing the output from NAND gate 136 to go low. This low output from gate 136 is transmitted by gate 138 and inverted to produce a high level which is applied to reset input 132 of flip-flop 120. This ends the pulse transmitted back to sensor coordinator 10 if it has not been previously terminated to indicate an alarm condition. The longest pulse width denotes the non-alarm condition.

The presence of an alarm condition is indicated to sensor coordinator 10 by transmitting a shortened status pulse. This is done in the following manner. Outputs Q4-Q7 of counter 110 are respectively applied to exclusive-or comparator gates 140A-140D. The second inputs to each of comparators 140A-140D are selectively tied to ground or +V by means of resistors 144 and jumper wires J1-J4, located on circuit board 146, as shown. The outputs from comparators 140A-140D are combined in NOR gate 148. The output of NOR gate 148 will be high only when the values of Q4-Q7 equal the value selected by jumper wires J1-J4. Since Q4-Q7 will be all low when the output from NOR gate 130 begins the pulse transmitted back to sensor coordinator 10, the output from gate 148 will go high a certain number of clock pulses later, depending on the setting of jumper wires J1-J4.

The output from gate 148 is applied to NAND gate 150. The other input to NANd gate 150 comes from a sensor and is low when the sensor is in the non-alarm condition. This low output disables gate 150, preventing the pulse from gate 148 from being transmitted thereby. When the sensor goes to the alarm state, gate 150 is enabled; and the pulse from gate 148 is transmitted through gate 150 to gate 138, thereby shortening the pulse transmitted back and indicating an alarm condition. Note that this status pulse can be terminated at different times to produce several different pulse widths which may be transmitted back to sensor coordinator 10 to indicate different conditions, depending on the setting of jumper wires J1-J4. Thus, one width may indicate that a fire has been detected, another pulse may indicate that there is an intrusion, and other pulse widths may indicate other conditions.

Circuitry 160 through 170 performs in the same manner as circuitry 140 through 150 described above and provides a pulse of a predetermined width as determined by the signal from a second sensor applied to NAND gate 160.

If a self-test is being performed, the decoder operates in the following manner. The synchronizing pulse 50 resets counter 110 as described above. The reset pulse applied to counter 110 is also applied to the reset input on an R-S flip-flop 170, causing its output to be zero. During the synchronizing pulse, capacitor C14 connected to the D input of a D flip-flop 172 charges to a high state through resistor R25. The self-test pulse is a very short pulse following immediately after synchronizing pulse 50. Due to the long time constant of resistor R22 and capacitor C12, counter 110 is not reset by the short self-test pulse 60. The synchronizing and self-test pulses are also applied to the clock input of flip-flop 172, and the leading edge of the self-test pulse 60 clocks the high level previously stored on capacitor C14 during the synchronizing pulse into flip-flop 172. This high output from flip-flop 172 sets R-S flip-flop 170, providing a high output therefrom as a signal to the sensor that it should perform a self-test. The next synchronizing pulse 50 resets flip-flop 170, ending the self-test cycle. Diode D8 and resistor R26 operate to discharge capacitor C14 during the 10 millisecond interval following the synchronizing pulse.

What is claimed is:

1. An intrusion alarm system, comprising:

a plurality of sensors for detecting the occurrence of an event and for producing an alarm signal indicative thereof;

a sensor coordinator;

a two-conductor cable interconnecting each of the plurality of sensors with the sensor coordinator;

the sensor coordinator including:

digital processor means; and modulator-demodulator means connected between said processor means and said cable, for transmitting signals from said processor means along said cable, and for receiving status signals returned by said sensors and providing digital signals representative thereof to said processor means;

the processor means periodically transmitting a synchronizing pulse and monitoring said cable thereafter to sense the presence of status pulses and to determine the width of said sensed pulses;

a like plurality of interface means, each of said interface means being connected in parallel to said cable and each associated with a respective one of said sensors, for responding to said synchronizing pulse by returning back along said cable to said sensor coordinator said status signal representative of the presence or absence of an alarm signal from the associated sensor;

each of said interface means including:

delay means for determining a delay time and for causing the status signal to be returned by said interface means after the elapse of the delay time following the transmission of the synchronizing pulse by said sensor coordinator;

modulator means, operative after the elapse of said delay time as determined by said delay means, for transmitting said status signal as a status pulse along said cable; and selection means for varying the width of said transmitted status pulse in response to the presence or absence of an alarm signal from the associated sensor;

said plurality of interface means responding sequentially to the synchronizing pulse so that the status signals from different interface means do not interfere;

the sensor coordinator further including means for sensing the presence of a status signal representative of an alarm condition and for providing an output signal indicative thereof;

a display for providing an indication of the condition of each of the plurality of sensors;

the processor means being further operative to provide signals for actuating said display;

a power supply for providing power from AC lines to said processor and said display, and to said cable for powering said plurality of sensors and associated interface means;

the power supply further including a battery and means for providing back-up power from said battery to said power supply upon a failure of power on said AC lines;

the processor means being operative to remove power to said display upon failure of power on said AC lines, whereby power stored in said battery is conserved.

2. The intrusion alarm system of claim 1 wherein said sensor coordinator further includes means for sensing an absence of a status pulse from one of said interface means connected to said cable and for providing an output indication thereof.

3. The intrusion alarm system of claim 1 further including:

means for transmitting a signal of ultrasonic frequency along said cable;

and wherein at least one of said sensors includes:

an acoustic transducer; and amplifier means for applying said ultrasonic signal on said cable to said transducer for excitation thereof.

4. The intrusion alarm system of claim 3 wherein said sensor coordinator and each of said interface means each include synchronous, digital circuitry;

and wherein said ultrasonic signal is applied to said sensor coordinator and to each of said interface means to provide a clock signal for said synchronous digital circuitry.

5. The intrusion alarm system of claim 1 wherein the modulator means includes:

means for connecting a low impedance across the conductors of said cable to transmit said status pulse.

6. The intrusion alarm system of claim 1 further including:

coding means for providing signals representative of a preselected pulse width;

and wherein the selection means is operative to vary the pulse width by selecting one of a plurality of predetermined distinct pulse widths, in response to the alarm signal from said associated sensor and the signals from said coding means, to allow a plurality of different status pulse widths to be selectively transmitted by the interface means in response to alarm signals from the associated sensors.

7. The intrusion alarm system of claim 6 further including:

means for transmitting a clock signal along said two-conductor cable.

8. The intrusion alarm system of claim 7 wherein said delay means includes:

counter means responsive to said clock signals for determining said delay time.

9. The intrusion alarm system of claim 8 wherein at least one of said sensors includes:

an acoustic transducer; and amplifier means for applying said clock signal to said transducer for excitation thereof.

10. The intrusion alarm system of claim 9 wherein said sensor coordinator further includes:

means for sensing an absence of a status pulse from one of said interface means connected to said cable and for providing an output indication thereof.

11. The intrusion alarm system of claim 19 wherein the digital processor means further includes:

at least one interrupt input;

and wherein the digital signals from said modulator-demodulator means are applied to said interrupt input of the processor means.

12. An intrusion alarm system, comprising:

a plurality of sensors for detecting the occurrence of an event and for producing an alarm signal indicative thereof;

a sensor coordinator;

a two-conductor cable interconnecting each of the plurality of sensors with the sensor coordinator;

the sensor coordinator including:

a digital processor means connected to said cable, for transmitting signals along said cable, and for receiving status signals returned by said sensors;

the processor means periodically transmitting a synchronizing pulse and monitoring said cable thereafter to sense the presence of status pulses and to determine the width of said sensed pulses;

a like plurality of interface means, each of said interface means being connected in parallel to said cable and each associated with a respective one of said sensors, for responding to said synchronizing pulse by returning back along said cable to said sensor coordinator said status signal representative of the presence or absence of an alarm signal from the associated sensor;

each of said interface means including: delay means for determining a delay time and for causing the status signal to be returned by said interface means after the elapse of the delay time following the transmission of the synchronizing pulse by said sensor coordinator;

modulator means, operative after the elapse of said delay time as determined by said delay means, for transmitting said status signal as a status pulse along sid cable; and selection means for varying the width of said transmitted status pulse in response to the presence or absence of an alarm signal from the associated sensor;

said plurality of interface means responding sequentially to the synchronizing pulse so that the status signals from different interface means do not interfere;

the sensor coordinator further including means for sensing the presence of a status signal representative of an alarm condition and for providing an output signal indicative thereof;

a display actuated by the processor means and for providing an indication of the condition of each of the plurality of sensors a power supply for providing power from AC lines to said processor means and to said cable for powering said plurality of sensors and associated interface means;

the power supply further including a battery and means for providing back-up power from said battery to said power supply upon a failure of power on said AC lines;

the processor means being operative to remove power to said display upon failure of power on said AC lines, whereby power stored in said battery is conserved.

13. The intrusion alarm system of claim 12 wherein said processor is operative to transmit a test pulse along said cable a predetermined time following said synchronizing pulse;

said interface means each being operative upon receipt of the test pulse to transmit a status pulse of a width indicating the presence or absence of an alarm signal from the associated sensor.

* * * * *